United States Patent
Noda et al.

(10) Patent No.: US 9,287,390 B2
(45) Date of Patent: Mar. 15, 2016

(54) MANUFACTURING METHOD OF SEMICONDUCTOR DEVICE

(71) Applicant: Semiconductor Energy Laboratory Co., Ltd., Atsugi-shi, Kanagawa-ken (JP)

(72) Inventors: Kosei Noda, Atsugi (JP); Toshinari Sasaki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/284,771

(22) Filed: May 22, 2014

(65) Prior Publication Data

US 2014/0256086 A1    Sep. 11, 2014

Related U.S. Application Data

(62) Division of application No. 13/197,825, filed on Aug. 4, 2011, now Pat. No. 8,748,224.

(30) Foreign Application Priority Data

Aug. 16, 2010   (JP) ................................ 2010-181832

(51) Int. Cl.
*H01L 21/00* (2006.01)
*H01L 29/10* (2006.01)
(Continued)

(52) U.S. Cl.
CPC ........ *H01L 29/66969* (2013.01); *H01L 21/477* (2013.01); *H01L 29/4908* (2013.01); *H01L 29/7869* (2013.01); *H01L 29/78603* (2013.01)

(58) Field of Classification Search
CPC .................. H01L 29/66969; H01L 21/477

USPC ............ 438/104, 149, 157, 161, 164; 257/43, 257/66, 67, 72

See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |

(Continued)

FOREIGN PATENT DOCUMENTS

| | | |
|---|---|---|
| CN | 101258607 A | 9/2008 |
| CN | 101335293 A | 12/2008 |

(Continued)

OTHER PUBLICATIONS

European Search Report (Application No. 11177094.7) Dated Nov. 16, 2011.

(Continued)

*Primary Examiner* — Hsien Ming Lee
(74) *Attorney, Agent, or Firm* — Eric J. Robinson; Robinson Intellectual Property Law Office, P.C.

(57) ABSTRACT

A transistor with superior electric characteristics is manufactured. An oxide insulating film is formed over a substrate, an oxide semiconductor film is formed over the oxide insulating film, heat treatment is then conducted at a temperature at which hydrogen contained in the oxide semiconductor film is desorbed and part of oxygen contained in the oxide insulating film is desorbed, then the heated oxide semiconductor film is etched into a predetermined shape to form an island-shaped oxide semiconductor film, a pair of electrodes is formed over the island-shaped oxide semiconductor film, a gate insulating film is formed over the pair of electrodes and the island-shaped oxide semiconductor film, and a gate electrode is formed over the gate insulating film.

18 Claims, 11 Drawing Sheets

(51) Int. Cl.
*H01L 29/12* (2006.01)
*H01L 29/04* (2006.01)
*H01L 29/66* (2006.01)
*H01L 29/49* (2006.01)
*H01L 29/786* (2006.01)
*H01L 21/477* (2006.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,074 | B2 | 9/2010 | Iwasaki |
| 7,910,490 | B2 | 3/2011 | Akimoto et al. |
| 7,932,521 | B2 | 4/2011 | Akimoto et al. |
| 7,935,582 | B2 | 5/2011 | Iwasaki |
| 7,956,361 | B2 | 6/2011 | Iwasaki |
| 8,049,225 | B2 | 11/2011 | Yamazaki et al. |
| 8,154,024 | B2 | 4/2012 | Iwasaki |
| 8,241,949 | B2 | 8/2012 | Miyanaga |
| 8,274,077 | B2 | 9/2012 | Akimoto et al. |
| 8,294,147 | B2 | 10/2012 | Yamazaki et al. |
| 8,304,300 | B2 | 11/2012 | Sakata et al. |
| 8,466,463 | B2 | 6/2013 | Akimoto et al. |
| 8,502,217 | B2 | 8/2013 | Sato et al. |
| 8,518,740 | B2 | 8/2013 | Yamazaki et al. |
| 8,629,069 | B2 | 1/2014 | Akimoto et al. |
| 8,669,550 | B2 | 3/2014 | Akimoto et al. |
| 8,748,224 | B2 * | 6/2014 | Noda et al. .................. 438/104 |
| 8,785,240 | B2 | 7/2014 | Watanabe |
| 8,785,242 | B2 | 7/2014 | Yamazaki et al. |
| 8,790,959 | B2 | 7/2014 | Akimoto et al. |
| 8,796,069 | B2 | 8/2014 | Akimoto et al. |
| 9,082,857 | B2 | 7/2015 | Yamazaki et al. |
| 9,099,562 | B2 | 8/2015 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308805 | A1 | 12/2008 | Akimoto et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0133531 | A1 | 6/2010 | Akimoto et al. |
| 2010/0159639 | A1 | 6/2010 | Sakata |
| 2010/0283049 | A1 | 11/2010 | Sato et al. |
| 2011/0104851 | A1 | 5/2011 | Akimoto et al. |
| 2011/0121290 | A1 | 5/2011 | Akimoto et al. |
| 2011/0151618 | A1 | 6/2011 | Yamazaki et al. |
| 2014/0329365 | A1 | 11/2014 | Yamazaki et al. |
| 2015/0340513 | A1 | 11/2015 | Akimoto et al. |

FOREIGN PATENT DOCUMENTS

| | | |
|---|---|---|
| EP | 1737044 A | 12/2006 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2159845 A | 3/2010 |
| EP | 2226847 A | 9/2010 |
| EP | 2339639 A | 6/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| | | |
|---|---|---|
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-099847 A | 5/2009 |
| JP | 2009-141002 A | 6/2009 |
| JP | 2009-224479 A | 10/2009 |
| JP | 2010-062548 A | 3/2010 |
| JP | 2010-080952 A | 4/2010 |
| WO | WO-2004/114391 | 12/2004 |
| WO | WO-2007/029844 | 3/2007 |
| WO | WO-2008/126879 | 10/2008 |
| WO | WO-2009/072532 | 6/2009 |
| WO | WO-2011/074409 | 6/2011 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Displays Workshops, Dec. 3, 2008, pp. 1637-1640.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (m=In, Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The"Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC-Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Appleid Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 208, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B. (Physical Review. B), 2008, vol. 77, pp. 245202-1-245202-6.

Orita.M et al. "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Chinese Office Action (Application No. 201110234368.0) Dated Mar. 3, 2015.

Chinese Office Action (Application No. 201110234368.0) Dated Nov. 11, 2015.

* cited by examiner

MANUFACTURING METHOD OF SEMICONDUCTOR DEVICE

BACKGROUND OF THE INVENTION

1. Field of the Invention

Embodiments of the present invention relate to a semiconductor device which includes a circuit including at least one semiconductor element such as a transistor, and a manufacturing method thereof. For example, embodiments of the present invention relate to an electronic device which includes, as a component, any of a power device mounted in a power circuit, a semiconductor integrated circuit including a memory, a thyristor, a converter, an image sensor, or the like, an electro-optical device typified by a liquid crystal display device, and a light-emitting display device including a light-emitting element.

2. Description of the Related Art

Transistors formed over a glass substrate or the like are manufactured using amorphous silicon, polycrystalline silicon, or the like, as typically seen in liquid crystal display devices. Although transistors including amorphous silicon have low field effect mobility, they can be formed over a larger glass substrate. On the other hand, although transistors including polycrystalline silicon have high field effect mobility, they are not suitable for being formed over a larger glass substrate.

In contrast to transistors including silicon, attention has been drawn to a technique by which a transistor is manufactured using an oxide semiconductor, and such a transistor is applied to an electronic device or an optical device. For example, Patent Document 1 and Patent Document 2 disclose a technique in which a transistor is manufactured using zinc oxide or an In—Ga—Zn—O-based oxide as an oxide semiconductor and the transistor is used as a switching element or the like of a pixel of a display device.

Meanwhile, it has been pointed out that hydrogen is a carrier source particularly in an oxide semiconductor. Therefore, some measures need to be taken to prevent hydrogen from entering the oxide semiconductor at the time of depositing the oxide semiconductor. Further, variation of a threshold voltage is suppressed by reducing the amount of hydrogen contained in not only the oxide semiconductor but also a gate insulating film in contact with the oxide semiconductor (see Patent Document 3).

REFERENCE

[Patent Document 1] Japanese Published Patent Application No. 2007-123861
[Patent Document 2] Japanese Published Patent Application No. 2007-96055
[Patent Document 3] Japanese Published Patent Application No. 2009-224479

SUMMARY OF THE INVENTION

However, conventional transistors including oxide semiconductors have low on/off ratio, and do not provide sufficient performance as switching elements in pixels of display devices. Further, the conventional transistors including oxide semiconductors are problematic because their threshold voltages are negative and they have normally-on characteristics.

It is an object of one embodiment of the present invention to provide transistors with superior electric characteristics.

One embodiment of the present invention is as follows: an oxide insulating film is formed over a substrate, an oxide semiconductor film is formed over the oxide insulating film, heat treatment is then conducted at a temperature at which hydrogen contained in the oxide semiconductor film is desorbed and part of oxygen contained in the oxide insulating film is desorbed, then the heated oxide semiconductor film is etched into a predetermined shape to form an island-shaped oxide semiconductor film, a pair of electrodes is formed over the island-shaped oxide semiconductor film, a gate insulating film is formed over the pair of electrodes and the island-shaped oxide semiconductor film, and a gate electrode is formed over the gate insulating film.

One embodiment of the present invention is as follows: an oxide insulating film is formed over a substrate, a pair of electrodes is formed over the oxide insulating film, an oxide semiconductor film is formed over the pair of electrodes and the oxide insulating film, heat treatment is conducted at a temperature at which hydrogen contained in the oxide semiconductor film is removed and part of oxygen contained in the oxide insulating film is desorbed, then the heated oxide semiconductor film is etched into a predetermined shape to form an island-shaped oxide semiconductor film, a gate insulating film is formed over the pair of electrodes and the island-shaped oxide semiconductor film, and a gate electrode is formed over the gate insulating film.

As the oxide insulating film formed over the substrate, an oxide insulating film from which part of oxygen is desorbed by heat treatment is used. The oxide insulating film from which part of oxygen is desorbed by heat treatment is preferably an oxide insulating film which contains oxygen with a higher proportion than a proportion of oxygen in the stoichiometric composition. Typical examples of the oxide insulating film from which part of oxygen is desorbed by heat treatment include films of silicon oxide, silicon oxynitride, silicon nitride oxide, aluminum oxide, aluminum oxynitride, gallium oxide, hafnium oxide, yttrium oxide, and the like.

In TDS (thermal desorption spectroscopy) analysis, the amount of oxygen desorbed from the oxide insulating film from which part of oxygen is desorbed by heat treatment is $1.0 \times 10^{18}$ atoms/cm$^3$ or more, preferably $1.0 \times 10^{20}$ atoms/cm$^3$ or more, more preferably $3.0 \times 10^{20}$ atoms/cm$^3$ or more at the oxygen atomic conversion.

The temperature at which hydrogen is desorbed from the oxide semiconductor film and part of oxygen contained in the oxide insulating film is diffused into the oxide semiconductor film is 150° C. or higher and lower than the strain point of a substrate used, preferably 250° C. to 450° C.

The oxide semiconductor film is formed over the oxide insulating film, and the heat treatment is conducted at a temperature at which hydrogen contained in the oxide semiconductor film is desorbed and part of oxygen contained in the oxide insulating film is desorbed, whereby part of oxygen contained in the oxide insulating film can be diffused into the oxide semiconductor film and hydrogen contained in the oxide semiconductor film can be desorbed. Note that the oxygen diffused into the oxide semiconductor film compensates for oxygen vacancies in the oxide semiconductor film, and thus the oxygen vacancies in the oxide semiconductor film are reduced. In addition, the oxygen semiconductor film serves as a blocking film against oxygen desorption out of the oxide insulating film, and thus oxygen is not desorbed so excessively from the oxide insulating film and oxygen remains in the oxide insulating film. In this manner, the concentration of hydrogen and the number of oxygen vacancies serving as carrier sources are reduced and defects at the interface between the oxide semiconductor film and the oxide insulating film can be reduced.

By a bond of an element contained in an oxide semiconductor and hydrogen, part of hydrogen serves as a donor to generate electrons as carriers. In addition, oxygen vacancies in the oxide semiconductor also serve as donors to generate electrons as carriers. For that reason, by reduction of the concentration of hydrogen and the number of oxygen vacancies in the oxide semiconductor film, a shift to a negative side of a threshold voltage can be suppressed.

Further, defects at the interface between the oxide semiconductor film and the oxide insulating film can be reduced by diffusion of part of oxygen into the oxide semiconductor film and at the same time the other part of oxygen remains in the oxide insulating film, so that a shift to a negative side of a threshold voltage can be suppressed.

Note that in this specification, an n-channel transistor whose threshold voltage is positive is defined as a normally-off transistor, while a p-channel transistor whose threshold voltage is negative is defined as a normally-off transistor. Further, an n-channel transistor whose threshold voltage is negative is defined as a normally-on transistor, while a p-channel transistor whose threshold voltage is positive is defined as a normally-on transistor.

A transistor is formed as follows: an oxide semiconductor film is formed over an oxide insulating film, heat treatment is conducted at a temperature at which hydrogen contained in the oxide semiconductor film is desorbed and part of oxygen contained in the oxide insulating film is desorbed, and then the oxide semiconductor film is etched into a predetermined shape. The transistor formed in this manner can have superior electric characteristics.

DETAILED DESCRIPTION OF THE INVENTION

Figure 1A:
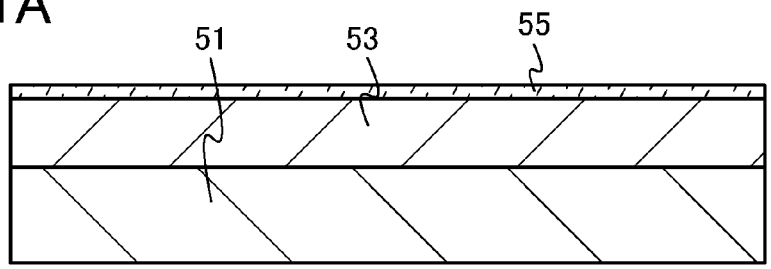
FIGS. 1A to 1E are cross-sectional views illustrating a process for manufacturing a semiconductor device according to one embodiment of the present invention.

Embodiments of the present invention will be described in detail with reference to the drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. Note that in structures of the present invention described hereinafter, like portions or portions having similar functions are denoted by the same reference numerals in different drawings, and description thereof is not repeated.

Note that in each drawing described in this specification, the size, the layer (film) thickness, or the region of each component is exaggerated for clarity in some cases. Therefore, embodiments of the present invention are not limited to such scales illustrated in the drawings.

Note that terms such as "first", "second", and "third" in this specification are used in order to avoid confusion among components, and the terms do not limit the components numerically. Therefore, for example, the term "first" can be replaced with the term "second", "third", or the like as appropriate.

(Embodiment 1)

FIGS. 1A to 1E are cross-sectional views illustrating a manufacturing process of a transistor as one mode of a structure of a semiconductor device. The cross-sectional view taken along the dot-dash line A-B in FIG. 2 corresponds to FIG. 1E.

Figure 2:
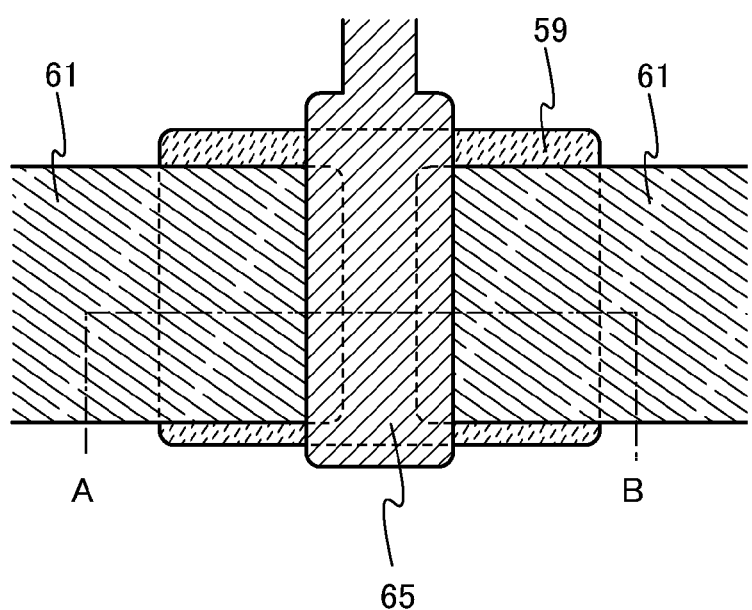
FIG. 2 is a top view illustrating a process for manufacturing a semiconductor device according to one embodiment of the present invention.

As illustrated in FIG. 1A, an oxide insulating film 53 is formed over a substrate 51, and an oxide semiconductor film 55 is formed over the oxide insulating film 53.

As the substrate 51, a glass substrate (also referred to as a "non-alkali glass substrate"), a quartz substrate, a ceramic substrate, a plastic substrate, or the like can be used as appropriate. Further, a flexible glass substrate or a flexible plastic substrate can be used as the substrate 51. As a plastic substrate, a substrate having low refractive index anisotropy is preferably used, and a polyether sulfone (PES) film, a polyimide film, a polyethylene naphthalate (PEN) film, a polyvinyl fluoride (PVF) film, a polyester film, a polycarbonate (PC) film, an acrylic resin film, a prepreg which includes a fibrous body in a partially-cured organic resin, or the like can be typically used.

The oxide insulating film 53 is formed with use of an oxide insulating film from which part of oxygen is desorbed by heat treatment. As such an oxide insulating film from which part of oxygen is desorbed by heat treatment, an oxide insulating film containing oxygen with a higher proportion than a proportion of oxygen in the stoichiometric composition is preferably used. The oxide insulating film from which part of oxygen is desorbed by heat treatment can diffuse oxygen into the oxide semiconductor film by heat treatment, because oxygen is desorbed from the oxide insulating film by heat treatment. Typical examples of the oxide insulating film 53 include films of silicon oxide, silicon oxynitride, silicon nitride oxide, aluminum oxide, aluminum oxynitride, gallium oxide, hafnium oxide, yttrium oxide, and the like.

Part of oxygen of the oxide insulating film containing oxygen with a higher proportion than a proportion of oxygen in the stoichiometric composition is desorbed by heat treatment. The amount of desorbed oxygen is $1.0 \times 10^{18}$ atoms/cm$^3$ or more, preferably $1.0 \times 10^{20}$ atoms/cm$^3$ or more, more preferably $3.0 \times 10^{20}$ atoms/cm$^3$ or more at the oxygen atomic conversion by TDS analysis.

Here, in TDS analysis, the measurement method of the amount of desorbed oxygen at the oxygen atomic conversion is described below.

The desorption amount of gas in the TDS analysis is proportional to an integral value of spectrum. Thus, from the ratio of the integral value of spectrum of the oxide insulating film to a reference value of a standard sample, the desorption amount of gas can be calculated. The reference value of the standard sample is a ratio of molecular density to an integral value of spectrum of a sample containing given molecules.

For example, from a TDS analysis result of a silicon wafer containing hydrogen at a given density, which is a standard sample, and a TDS analysis result of an oxide insulating film, the amount of oxygen molecules ($N_{O2}$) desorbed from the oxide insulating film can be obtained by Equation 1.

$$N_{O2} = N_{H2}/S_{H2} \times S_{O2} \times \alpha \quad \text{(Equaltion 1)}$$

$N_{H2}$ is a value obtained by conversion of the number of hydrogen molecules desorbed from the standard sample with density. $S_{H2}$ is an integral value of spectrum of a standard sample which is analyzed by TDS. In other words, the reference value of the standard sample is $N_{H2}/S_{H2}$. $S_{O2}$ is an integral value of spectrum when the oxide insulating film is analyzed by TDS. $\alpha$ is a coefficient which influences spectrum intensity in TDS analysis. As for the details of Equation 1, refer to JPH6-275697A. Note that the amount of oxygen desorbed from the oxide insulating film is measured with use of a silicon wafer containing hydrogen atoms at $1 \times 10^{16}$ atoms/cm$^3$ as a standard sample, by using a thermal desorption spectrometer, EMD-WA1000S/W manufactured by ESCO Ltd.

In addition, $N_{O2}$ is the amount of desorbed oxygen molecules ($O_2$). In the oxide insulating film, the amount of desorbed oxygen expressed in oxygen atom doubles the amount of desorbed oxygen expressed in oxygen molecule ($O_2$).

The oxide insulating film 53 is 50 nm thick or more, preferably from 200 nm to 500 nm. With use of the thick oxide insulating film 53, the amount of oxygen desorbed from the oxide insulating film 53 can be increased, and defects at the interface between the oxide insulating film 53 and an oxide semiconductor film to be formed later can be reduced.

The oxide insulating film 53 is formed by a sputtering method, a CVD method or the like. Preferably, the oxide insulating film from which part of oxygen is desorbed by heat treatment is easily formed by a sputtering method.

When the oxide insulating film from which part of oxygen is desorbed by heat treatment is formed by a sputtering method, the amount of oxygen contained in a deposition gas is preferably large, and oxygen ($O_2$), a mixed gas of oxygen ($O_2$) and a rare gas (such as Ar), or the like can be used. Typically, the oxygen concentration of a deposition gas is preferably from 6% to 100%.

A silicon oxide film can be formed as a typical example of such an oxide insulating film from which part of oxygen is desorbed by heat treatment. In that case, the silicon oxide film is preferably formed by a RF sputtering method under the following conditions: quartz (preferably synthetic quartz) is used as a target; the substrate temperature is from 30° C. to 450° C. (preferably from 70° C. to 200° C.); the distance between the substrate and the target (the T-S distance) is from 20 mm to 400 mm (preferably from 40 mm to 200 mm); the pressure is from 0.1 Pa to 4 Pa (preferably from 0.2 Pa to 1.2 Pa), the high-frequency power is from 0.5 kW to 12 kW (preferably from 1 kW to 5 kW); and the proportion of oxygen ($O_2/(O_2+Ar)$) in the deposition gas is from 1% to 100% (preferably from 6% to 100%). Note that a silicon target may be used as the target instead of the quartz (preferably synthetic quartz) target. In addition, oxygen alone may be used as the deposition gas.

As the oxide semiconductor film 55, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide can be used. Here, an n-component metal oxide is constituted by n kinds of metal oxides. Preferably, the energy gap of the metal oxide which can form the oxide semiconductor film 55 is 2 eV or more, preferably 2.5 eV or more, further preferably 3 eV or more. In this manner, off-state current of a transistor can be reduced by using a metal oxide having a wide band gap.

In addition, as the oxide semiconductor film, a thin film of a material represented by the chemical expression, $InMO_3(ZnO)_m$ (m>0), can be used. Here, M represents one or more metal elements selected from the group of Zn, Ga, Al, Mn, and Co. For example, M can be Ga, Ga and Al, Ga and Mn, Ga and Co, or the like.

In the case where an In—Zn—O-based material is used as an oxide semiconductor, a target used has a composition ratio of In:Zn=50:1 to 1:2 in an atomic ratio ($In_2O_3:ZnO$=25:1 to 1:4 in a molar ratio), preferably, In:Zn=20:1 to 1:1 in an atomic ratio ($In_2O_3:ZnO$=10:1 to 1:2 in a molar ratio), further preferably, In:Zn=15:1 to 1.5:1 in an atomic ratio ($In_2O_3:ZnO$=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

Note that the oxide semiconductor film 55 contains hydrogen. Note that hydrogen may be contained in the oxide semiconductor film 55 in the form of a hydrogen molecule, water, a hydroxyl group, or hydride in some cases, in addition to a hydrogen atom.

The concentration of an alkali metal or an alkaline earth metal contained in the oxide semiconductor film 55 is preferably $2 \times 10^{16}$ atoms/cm$^3$ or less, or $1 \times 10^{18}$ atoms/cm$^3$ or less.

The thickness of the oxide semiconductor film 55 is preferably from 3 nm to 50 nm.

The oxide semiconductor film 55 can be formed by a sputtering method, a coating method, a printing method, a pulsed laser deposition method, or the like can be used.

In this embodiment, the oxide semiconductor film 55 is formed by a sputtering method using an In—Ga—Zn—O-based oxide target. Alternatively, the oxide semiconductor film 55 can be formed by a sputtering method in a rare gas (typically, argon) atmosphere, an oxygen atmosphere, or a mixed atmosphere of a rare gas and oxygen.

As a sputtering gas used for forming the oxide semiconductor film 55, it is preferable to use a high-purity gas from which an impurity such as hydrogen, water, a hydroxyl group, or hydride is removed. When the oxide semiconductor film 55 is formed when the substrate temperature is from 100° C. to 600° C., preferably from 200° C. to 400° C., the impurity concentration in the oxide semiconductor film 55 can be reduced.

Then heat treatment is conducted on the substrate 51 to remove hydrogen from the oxide semiconductor film 55, and to diffuse part of oxygen contained in the oxide insulating film 53 into the oxide semiconductor film 55 and into a region of the oxide insulating film 53 near the interface between the oxide insulating film 53 and the oxide semiconductor film 55

In this manner, deposition of the oxide semiconductor film is conducted while the heat treatment is conducted, or heat treatment is performed after the deposition of the oxide semiconductor film, and thereby the oxide semiconductor film can have a region where crystals are aligned along the C-axis.

A heat treatment apparatus used for the heat treatment is not limited to a particular apparatus, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The temperature of the heat treatment is preferably a temperature at which hydrogen is removed from the oxide semiconductor film 55 and part of oxygen contained in the oxide insulating film 53 is desorbed and is diffused into the oxide semiconductor film 55. The temperature is typically 150° C. or higher and lower than the strain point of the substrate 51, preferably 250° C. to 450° C.

The heat treatment is preferably conducted in an inert gas atmosphere; typically it is preferably performed in a rare gas (such as helium, neon, argon, xenon, or krypton) atmosphere or a nitrogen atmosphere. Alternatively, the heat treatment may be conducted in an oxidative atmosphere.

Figure 1B:
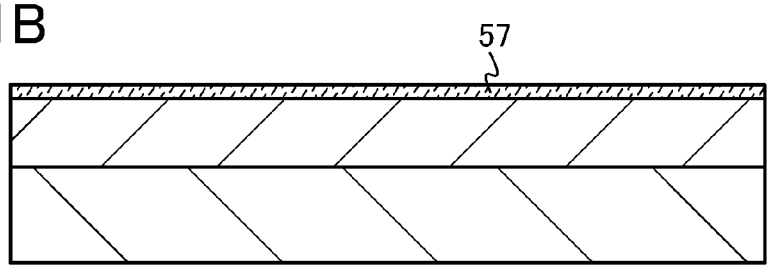

This heat treatment can remove hydrogen from the oxide semiconductor film 55 and can diffuse a part of oxygen contained in the oxide insulating film 53 into the oxide semiconductor film 55 and into a region of the oxide insulating film 53 near the interface between the oxide insulating film 53 and the oxide semiconductor film 55. In this process, oxygen vacancies in the oxide semiconductor film 55 can be reduced and oxygen is diffused into a region of the oxide insulating film 53 near the interface of the oxide insulating film 53 and the oxide semiconductor film 55, thereby reducing defects at the interface between the oxide semiconductor film and the oxide insulating film. As a result, as illustrated in FIG. 1B, an oxide semiconductor film 57 with the lowered hydrogen concentration and the reduced oxygen vacancies can be formed.

The heat treatment is conducted when the oxide insulating film 53 is covered with the oxide semiconductor film 55, so that part of oxygen in the oxide insulating film 53 is diffused into the oxide semiconductor film 55. Thus, the oxygen vacancies of the oxide semiconductor film 55 can be reduced. In addition, since the oxide insulating film 53 is covered with the oxide semiconductor film 55 and the surface of the oxide insulating film 53 is not exposed, the amount of oxygen going out of the oxide insulating film 53 is reduced, so that defects at the interface between the oxide insulating film 53 and the oxide semiconductor film 55 can be efficiently reduced.

Next, after a mask is formed over the oxide semiconductor film 57, the oxide semiconductor film 57 is etched with the use of the mask to form an island-shaped oxide semiconductor film 59. After that, the mask is removed (see FIG. 1C).

The mask used in the etching of the oxide semiconductor film 57 can be formed as appropriate by a photolithography process, an inkjet method, a printing method, or the like. Wet etching or dry etching may be employed as appropriate for the etching of the oxide semiconductor film 57.

Figure 1C:
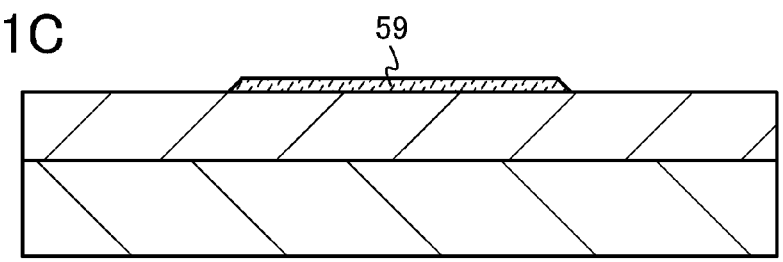
Figure 1D:
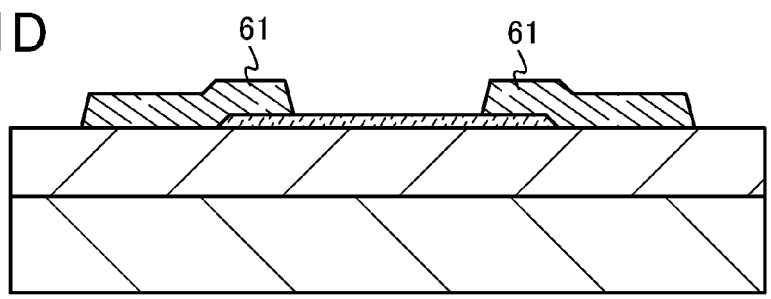

Next, as illustrated in FIG. 1D, a pair of electrodes 61 in contact with the oxide semiconductor film 59 is formed.

At this time, the pair of electrodes 61 functions as a source electrode and a drain electrode.

The pair of electrodes 61 can be formed using a metal element selected from the group of aluminum, chromium, copper, tantalum, titanium, molybdenum, and tungsten; an alloy containing any of these metal elements as a component; an alloy containing these metal elements in combination; and the like. Further, one or more metal elements selected from the group of manganese, magnesium, zirconium, and beryllium may be used. In addition, the pair of electrodes 61 can have a single-layer structure or a stacked structure having two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given.

The pair of electrodes 61 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using any of the above light-transmitting conductive materials and any of the above metal elements.

The pair of electrodes 61 is formed by a printing method or an inkjet method. Alternatively, after a conductive film is formed by a sputtering method, a CVD method, an evaporation method or the like, a mask is formed over the conductive film and the conductive film is etched, and thereby the pair of electrodes 61 is formed. The mask formed over the conductive film can be formed by an inkjet method, a printing method, a photolithography method, or the like as appropriate.

At this time, the conductive film is formed over the oxide semiconductor film 59 and the oxide insulating film 53, and etched into a predetermined pattern to form the pair of electrodes 61.

Note that the conductive film is formed over the oxide semiconductor film 57, a concavo-convex shaped mask is formed by a multi-tone photomask, the oxide semiconductor film 57 and the conductive film are etched with use of the mask, and then the concavo-convex shaped mask is separated by ashing, the conductive film is etched with use of the separated masks to form the island-shaped oxide semiconductor film 59 and the pair of electrodes 61. In this process, the number of the photomasks used and the number of steps in the photolithography process can be reduced.

Then, a gate insulating film 63 is formed over the oxide semiconductor film 59 and the pair of electrodes 61.

Next, a gate electrode 65 is formed in a region which is above the gate insulating film 63 and overlaps with the oxide semiconductor film 59.

Figure 1E:
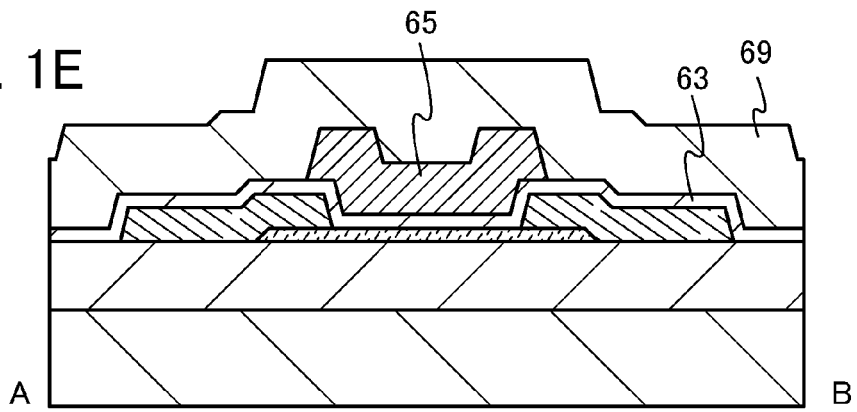

After that, an insulating film 69 may be formed as a protective film (FIG. 1E). In addition, after contact holes are formed in the gate insulating film 63 and the insulating film 69, wirings connected to the pair of electrodes 61 may be formed.

The gate insulating film 63 can be formed with a single layer or a stacked layer of silicon oxide, silicon oxynitride, silicon nitride, silicon nitride oxide, aluminum oxide, aluminum oxynitride, or gallium oxide. A portion of the gate insulating film 63 which is in contact with the oxide semiconductor film 59 preferably contains oxygen, particularly, the gate insulating film 63 is preferably formed of a silicon oxide film. By using the silicon oxide film, it is possible to diffuse oxygen to the oxide semiconductor film 59, so that its characteristics can be improved.

When a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide is used as the gate insulating film 63, the physical thickness of the gate insulating film can be increased so that gate leakage current can be reduced. Further, a stacked structure can be used in which a high-k material and one or more of silicon oxide, silicon nitride, silicon oxynitride, silicon nitride oxide, aluminum oxide, aluminum oxynitride, and gallium oxide are stacked. For example, the thickness of the gate insulating film 63 is preferably from 1 nm to 300 nm, and more preferably from 5 nm to 50 nm. In contrast, when the thickness of the gate insulating film 63 is 5 nm or more, gate leakage current can be reduced.

Before the gate insulating film 63 is formed, the surface of the island-shaped oxide semiconductor film 59 may be exposed to plasma of an oxidative gas such as oxygen, ozone, or dinitrogen monoxide so as to be oxidized, thereby reducing the oxygen vacancies.

The gate electrode 65 can be formed using a metal element selected from the group of aluminum, chromium, copper, tantalum, titanium, molybdenum, and tungsten; an alloy containing any of these metal elements as a component; an alloy containing these metal elements in combination; and the like. Further, one or more metal elements selected from the group of manganese, magnesium, zirconium, and beryllium may be used. Further, the gate electrode 65 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given.

The gate electrode 65 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked-layer structure formed using any of the above light-transmitting conductive materials and any of the above metal elements.

The insulating film 69 can be formed as appropriate with any of the insulating films listed for the gate insulating film 63.

After that, heat treatment may be performed.

Through the above steps, a transistor having the oxide semiconductor film in a channel formation region can be formed.

In this embodiment, the heat treatment is performed when the surface of the oxide insulating film is covered with the oxide semiconductor film, and then the oxide semiconductor film is etched into a predetermined shape to expose part of the oxide insulating film. Accordingly, the amount of oxygen going out of the oxide insulating film can be suppressed, part of oxygen can be diffused into the oxide semiconductor film to reduce oxygen vacancies in the oxide semiconductor film, and hydrogen can be desorbed from the oxide semiconductor film. As a result, as well as reduction of hydrogen and oxygen vacancies, which are carrier sources of the oxide semiconductor film, reduction of defects at the interface between the oxide semiconductor film and the oxide insulating film can be achieved. Accordingly, the threshold voltage of the transistor can be prevented from shifting to a negative side.

(Embodiment 2)

In Embodiment 2, a manufacturing method of a transistor having a structure different from the transistor described in Embodiment 1 will be described with reference to FIGS. 3A to 3D, and FIG. 4. Embodiment 2 is different from Embodiment 1 in that a pair of electrodes is provided between an oxide insulating film and an oxide semiconductor film. Note that the cross-sectional view taken along the dot-dash line A-B in FIG. 4 corresponds to FIG. 3D.

Figure 3A:
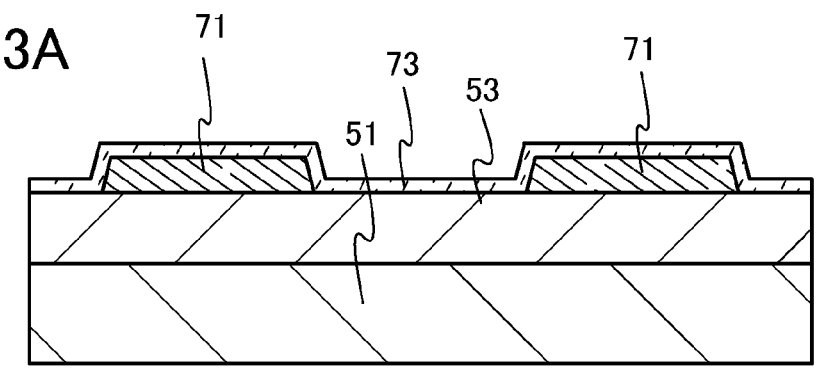
FIGS. 3A to 3D are cross-sectional views illustrating a process for manufacturing a semiconductor device according to one embodiment of the present invention.
Figure 3B:
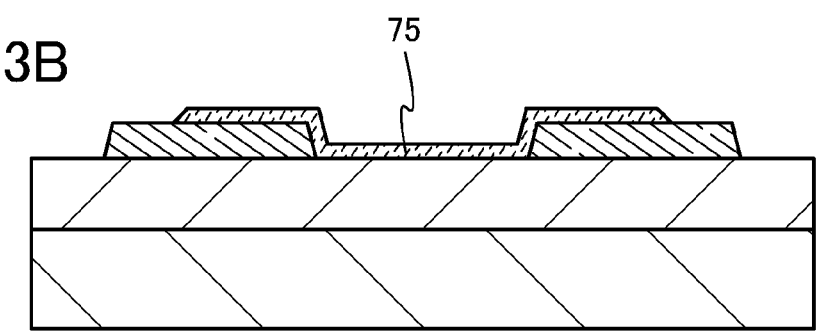

As illustrated in FIG. 3A, the oxide insulating film 53 is formed over the substrate 51 as in Embodiment 1. A pair of electrodes 71 is formed over the oxide insulating film 53. An oxide semiconductor film 73 is formed over the pair of electrodes 71 and the oxide insulating film 53.

The pair of electrodes 71 can be formed as appropriate by using a material and by a formation method which are similar to those of the pair of electrodes 61 described in Embodiment 1.

The oxide semiconductor film 73 can be formed as appropriate by using a material and by a formation method which are similar to those of the oxide semiconductor film 55 described in Embodiment 1.

Then, as in Embodiment 1, the substrate 51 is heated so that an oxide semiconductor film with the lowered hydrogen concentration and the reduced oxygen vacancies is formed. After that, a mask is formed over the oxide semiconductor film with the lowered hydrogen concentration and the reduced oxygen vacancies and etching is conducted on the oxide semiconductor film with the lowered hydrogen concentration and the reduced oxygen vacancies to form an island-shaped oxide semiconductor film 75. Then, the mask is removed (see FIG. 3B).

Figure 3C:
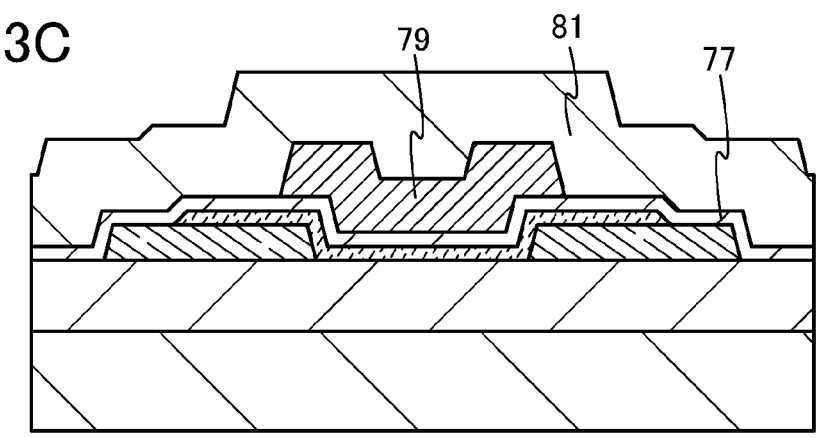
Figure 3D:
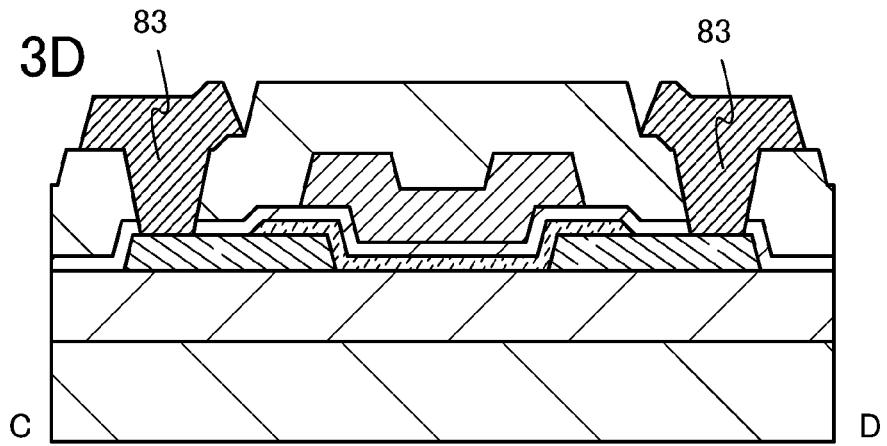
Figure 4:
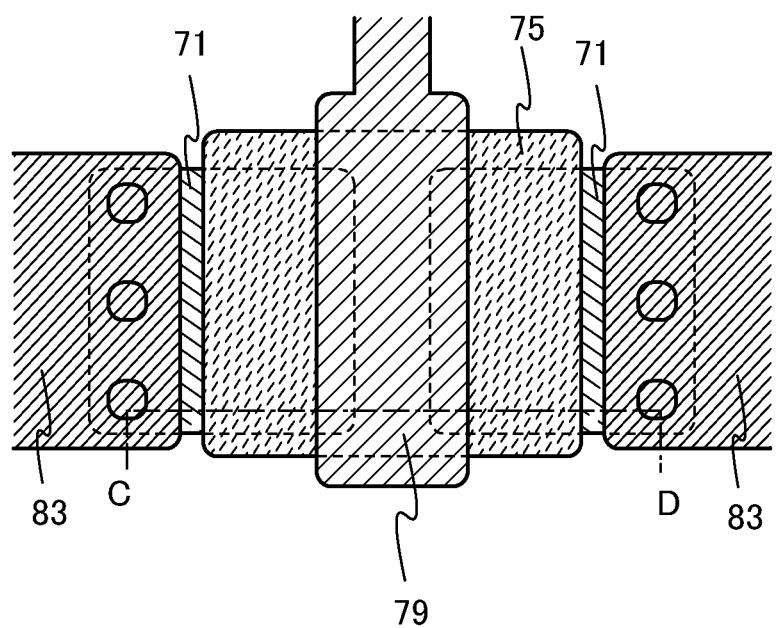
FIG. 4 is a top view illustrating a process for manufacturing a semiconductor device according to one embodiment of the present invention.

As illustrated in FIG. 3C, a gate insulating film 77 is formed over the pair of electrodes 71 and the oxide semiconductor film 75. Then, a gate electrode 79 is formed in a region which is above the gate insulating film 77 and overlaps with the oxide semiconductor film 75. Then, an insulating film 81 may be formed over the gate insulating film 77 and the gate electrode 79 as a protective film.

The gate insulating film 77 can be formed as appropriate by using a material and by a formation method which are similar to those of the gate insulating film 63 described in Embodiment 1.

The gate electrode 79 can be formed as appropriate by using a material and by a formation method which are similar to those of the gate electrode 65 described in Embodiment 1.

The insulating film 81 can be formed as appropriate by using a material and by a formation method which are similar to those of the insulating film 69 described in Embodiment 1.

Then, after a mask is formed over the insulating film 81, the gate insulating film 77 and the insulating film 81 are partially etched to form contact holes. Wirings 83 are formed so as to be connected to the pair of electrodes 71 through the contact holes.

The wirings 83 can be formed as appropriate by using a material and a formation method which are similar to those of the pair of electrodes 71.

Through the above steps, the transistor having the oxide semiconductor film in a channel formation region can be formed.

In this embodiment, as well as reduction of hydrogen and oxygen vacancies, which are carrier sources of the oxide semiconductor film, reduction of defects at the interface between the oxide semiconductor film and the oxide insulating film can be achieved. Accordingly, the threshold voltage of the transistor can be prevented from shifting to a negative side.

(Embodiment 3)

In Embodiment 3, a manufacturing method of a transistor where a contact resistance between an oxide semiconductor film and a pair of wirings can be decreased more than those of the transistors described in Embodiment 1 and Embodiment 2 will be described with reference to FIGS. 1A to 1E and FIGS. 5A to 5E.

Figure 5A:
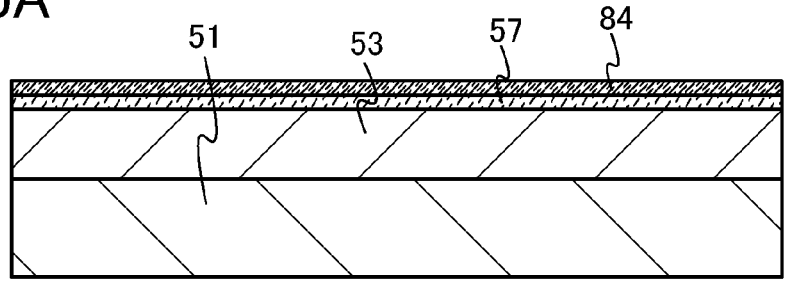
FIGS. 5A to 5E are cross-sectional views illustrating a process for manufacturing a semiconductor device according to one embodiment of the present invention.
Figure 5B:
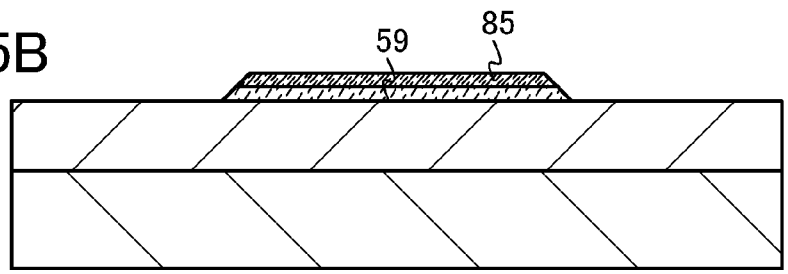

As in Embodiment 1, in the steps illustrated in FIGS. 1A and 1B, the oxide semiconductor film 55 is formed over the oxide insulating film 53 and is heated to form the oxide semiconductor film 57 with the lowered hydrogen concentration and the reduced oxygen vacancies. Next, as illustrated in FIG. 5A, a buffer 84 having an n-type conductivity is formed over the oxide semiconductor film 57 with the lowered hydrogen concentration and the reduced oxygen vacancies.

For the buffer 84 having an n-type conductivity, a metal oxide selected from the group of indium oxide, indium tin oxide, indium zinc oxide, tin oxide, zinc oxide, and tin zinc oxide, or a material of the metal oxide which contains one or more elements selected from the group of aluminum, gallium, and silicon can be used. With such a structure, the contact resistance between the oxide semiconductor film and the pair of electrodes serving as a source electrode and a drain electrode to be formed later can be reduced.

In this case, when the oxide semiconductor film is heated to remove hydrogen from the oxide semiconductor film, oxygen is concurrently diffused into the oxide semiconductor film from the oxide insulating film. After that, the buffer 84 having an n-type conductivity is formed over the oxide semiconductor film, thereby sufficiently desorbing hydrogen from the oxide semiconductor film. As a result, the hydrogen concentration and the oxygen vacancies in the oxide semiconductor film can be reduced, and thereby the threshold voltage of the transistor can be prevented from shifting to a negative side.

Next, after a mask is formed over the buffer 84 having an n-type conductivity, the oxide semiconductor film 57 with the lowered hydrogen concentration and the reduced oxygen vacancies and the buffer 84 having an n-type conductivity are etched to form the island-shaped oxide semiconductor film 59 and an island-shaped buffer 85 having an n-type conductivity. After that, the mask is removed (see FIG. 5B).

Figure 5C:
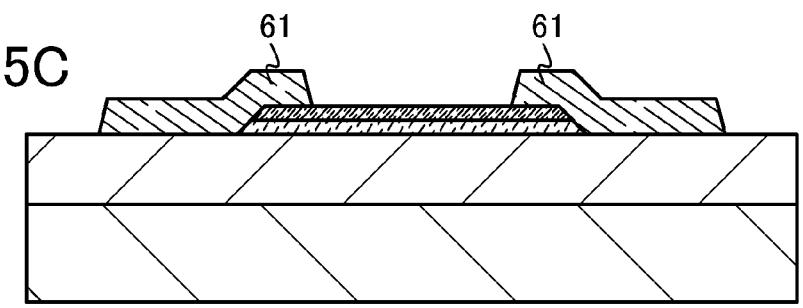
Figure 5D:
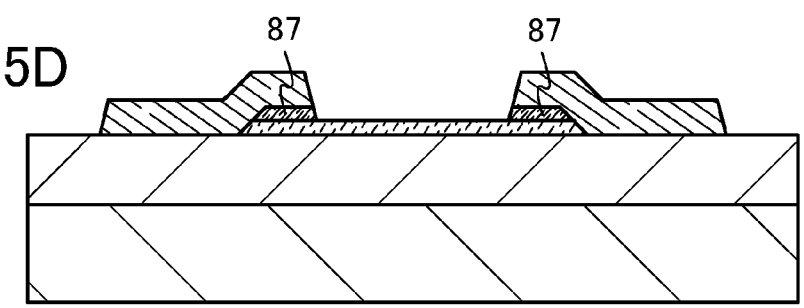
Figure 5E:
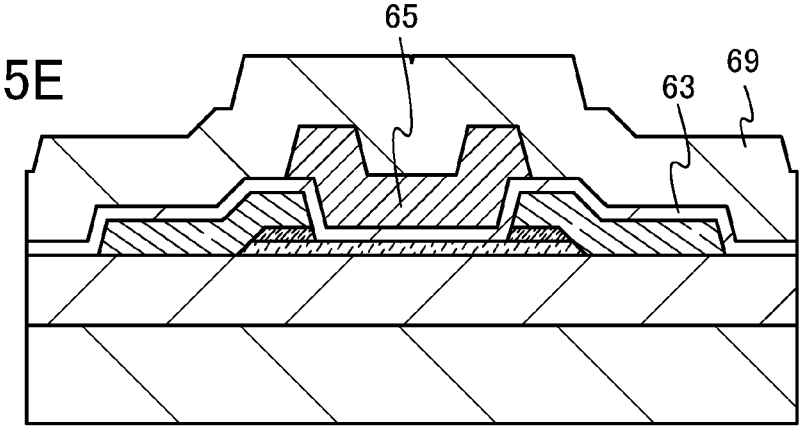

As illustrated in FIG. 5C, the pair of electrodes 61 is formed over the island-shaped oxide semiconductor film 59 and the buffer 85 having an n-type conductivity. In this case, in order to keep the film quality of the gate insulating film, a material which does not extract oxygen from the gate insulating film is preferably used as the pair of electrodes 61. Examples of the material of the pair of electrodes 61 include tungsten, molybdenum, and the like. However, tungsten or molybdenum unfortunately turns into a highly-resistant metal oxide in a region contacting with the oxide semiconductor film and the gate insulating film. For that reason, the buffer having an n-type conductivity is provided between the island-shaped oxide semiconductor film 59 and the pair of electrodes 61 so that the contact resistance between the island-shaped oxide semiconductor film 59 and the pair of electrodes 61 can be reduced.

Next, with use of a mask (not illustrated) formed over the pair of electrodes 61, an exposed portion of the buffer 85 having an n-type conductivity is etched to form a pair of buffers 87 having an n-type conductivity.

Note that it is possible that after the mask formed over the pair of electrodes 61 is removed, the pair of electrodes 61 is used as a mask and an exposed portion of the buffer 85 having an n-type conductivity is etched, so that the pair of buffers 87 having an n-type conductivity is formed.

When the buffer 85 having an n-type conductivity is etched, a condition where the island-shaped oxide semiconductor film 59 is not etched and the buffer 85 having an n-type conductivity is selectively etched (a condition with a high etching selectivity) is preferably adopted. In addition, if the etching selectivity between the island-shaped oxide semiconductor film 59 and the buffer 85 having an n-type conductivity is low, the island-shaped oxide semiconductor film 59 is partially etched into a shape having a groove (a depressed portion) as well as the buffer 85 having an n-type conductivity.

In this embodiment, because the pair of the buffers 87 having an n-type conductivity are provided between the island-shaped oxide semiconductor film 59 and the pair of electrodes 61, the contact resistance between the island-shaped oxide semiconductor film 59 and the pair of electrodes 61 can be lowered. As a result, an on-state current of the transistor can be prevented from being reduced.

Next, as in Embodiment 1, the gate insulating film 63, the gate electrode 65 and the insulating film 69 are formed. In addition, after contact holes are formed in the gate insulating film 63 and the insulating film 69, wirings may be formed so as to be connected to the pair of electrodes 61.

Through the above steps, the transistor having the oxide semiconductor film in a channel formation region can be formed.

In this embodiment, because the oxide semiconductor film with the lowered hydrogen concentration and the reduced oxygen vacancies is formed and the buffer having an n-type conductivity is formed to reduce the contact resistance between the oxide semiconductor film and the pair of wirings, the threshold voltage of the transistor can be prevented from shifting to a negative side and the on-state current of the transistor can be prevented from being reduced.

(Embodiment 4)

In Embodiment 4, a transistor having a large amount of on-state current and high field effect mobility or a transistor with a controlled threshold voltage will be described with reference to FIGS. 6A to 6D.

Figure 6A:
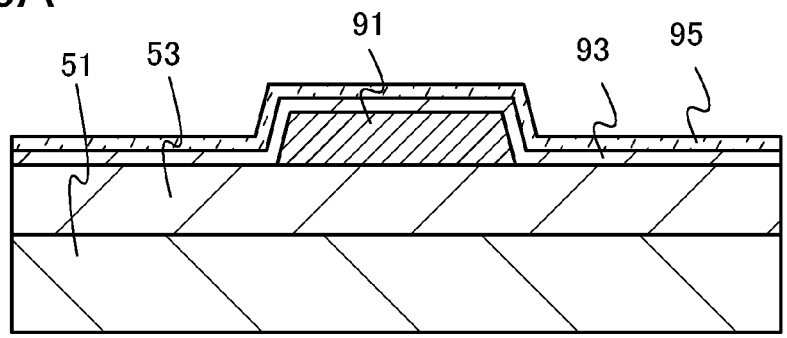
FIGS. 6A to 6D are cross-sectional views illustrating a process for manufacturing a semiconductor device according to one embodiment of the present invention.

As illustrated in FIG. 6A, the oxide insulating film 53 is formed over the substrate 51. A first gate electrode 91 is formed over the oxide insulating film 53. A first gate insulating film 93 is formed over the oxide insulating film 53 and the first gate electrode 91. An oxide semiconductor film 95 is formed over the first gate insulating film 93.

The first gate electrode 91 can be formed in a manner similar to that of the gate electrode 65 in Embodiment 1.

The first gate insulating film 93 can be formed in a manner similar to that of the gate insulating film 63 in Embodiment 1.

The oxide semiconductor film 95 can be formed in a manner similar to that of the oxide semiconductor film 55 in Embodiment 1.

Figure 6B:
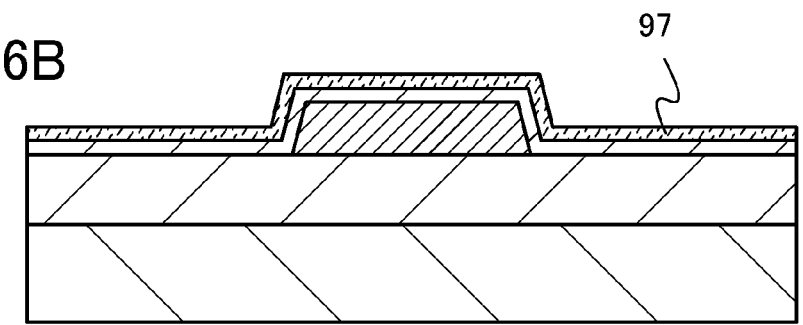
Figure 6C:
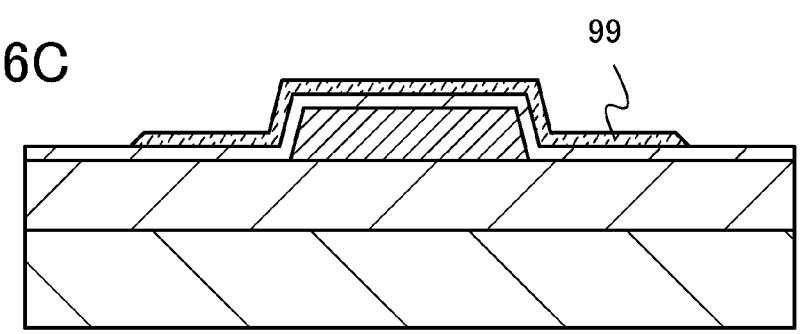

Next, as illustrated in FIG. 6B, as in Embodiment 1, the oxide semiconductor film 95 is heated to form an oxide semiconductor film 97 with the lowered hydrogen concentration and the reduced oxygen vacancies.

Then, a mask is formed over the oxide semiconductor film 97 and the oxide semiconductor film 97 is etched to form an island-shaped oxide semiconductor film 99. After that, the mask is removed (see FIG. 6C).

Figure 6D:
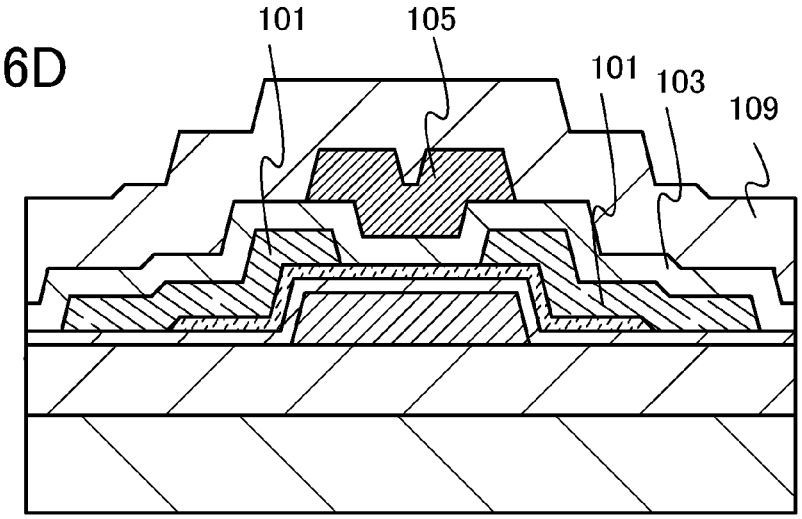

Next, as illustrated in FIG. 6D, a pair of electrodes 101 is formed over the island-shaped oxide semiconductor film 99. Then, a second gate insulating film 103 is formed over the island-shaped oxide semiconductor film 99 and the pair of electrodes 101. A second gate electrode 105 is formed in a region which is above the second gate insulating film 103 and overlaps with the island-shaped oxide semiconductor film 99. An insulating film 109 may be formed over the second gate insulating film 103 and the second gate electrode 105 as a protective film.

The pair of electrodes 101 can be formed in a manner similar to that of the pair of electrodes 61 described in Embodiment 1.

The second gate insulating film 103 can be formed in a manner similar to that of the gate insulating film 63 in Embodiment 1.

The second gate electrode 105 can be formed in a manner similar to that of the gate electrode 65 described in Embodiment 1.

The insulating film 109 can be formed in a manner similar to that of the insulating film 69 described in Embodiment 1.

The first gate electrode 91 and the second gate electrode 105 may be connected. In this case, the first gate electrode 91 and the second gate electrode 105 have the same potential and a channel formation region is formed on the first gate insulating film 93 side and on the second gate insulating film 103 side of the oxide semiconductor film 99, and thereby the on-state current and field effect mobility of the transistor can be increased.

Alternatively, it is also possible that the first gate electrode 91 and the second gate electrode 105 are not connected and have different applied potentials. In this case, the threshold voltage of the transistor can be controlled.

In this embodiment, the pair of electrodes is formed between the island-shaped oxide semiconductor film 99 and the second gate insulating film 103, but the pair of electrodes may be formed between the first gate insulating film 93 and the island-shaped oxide semiconductor film 99.

Through the above-described steps, the transistor having a plurality of gate electrodes can be formed.

(Embodiment 5)

In Embodiment 5, a method which can lower the hydrogen concentration of an oxide semiconductor film more than the methods described in Embodiments 1 to 4 will be described. Note that description of Embodiment 5 is made with reference to Embodiment 1; however, Embodiment 5 can be applied to Embodiments 2 to 4 as appropriate.

In FIG. 1A, the substrate 51 is heated before the oxide insulating film 53 is formed over the substrate 51. The oxide insulating film 53 and the oxide semiconductor film 55 are formed over the substrate 51.

The heating temperature of the substrate 51 is preferably a temperature which enables desorption of hydrogen adsorbed to or contained in the substrate 51. Typically, the temperature is 100° C. or higher and lower than a strain point of the substrate. In addition, the heat treatment on the substrate 51 is preferably conducted in an atmosphere with low hydrogen content. Preferably, it is conducted in high vacuum of $1 \times 10^{-4}$ Pa or less. As a result, hydrogen, hydrogen molecules, water, a hydroxyl group, hydride etc., adsorbed on the surface of the substrate can be reduced.

Further, a series of steps of the heat treatment on the substrate 51 to the formation of the oxide semiconductor film 55 is performed continuously in vacuum without exposure to air. Therefore, hydrogen, hydrogen molecules, water, a hydroxyl group, hydride etc., are not adsorbed on the substrate 51, the oxide insulating film 53 and the oxide semiconductor film 55, and in the heat treatment on the oxide semiconductor film 55, hydrogen diffusion into the oxide semiconductor film 55 from the substrate 51 and the oxide insulating film 53 can be suppressed, and thus the hydrogen concentration of the oxide semiconductor film 57 which is heated, illustrated in FIG. 1B can be lowered. As a result, the threshold voltage of the transistor can be prevented from shifting to a negative side.

(Embodiment 6)

The transistor described in any of Embodiments 1 to 5 is formed, and a semiconductor device having a display function (also referred to as a display device) can be manufactured using the transistor for a pixel portion and further for a driver circuit. Further, part of or the entire driver circuit including transistors can be formed over a substrate where the pixel portion is formed; thus, a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC and the like including a controller are mounted on the panel. Furthermore, an element substrate, which corresponds to one mode before the display element is completed in a manufacturing process of the display device, is provided with means for supplying current to the display element in each pixel. Specifically, the element substrate may have a mode in which only a pixel electrode of the display element is provided, a mode after a conductive film to be a pixel electrode is formed and before the pixel electrode is formed by etching the conductive film, or any other states.

Note that a display device in this specification means an image display device, a display device, or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP at the end of which a printed wiring board is provided; and a module having an integrated circuit (IC) which is directly mounted on a display element by a chip on glass (COG) method.

(Embodiment 7)

A semiconductor device disclosed in this specification can be applied to electronic paper. Electronic paper can be used for electronic devices, which can display data, of a variety of fields. For example, electronic paper can be applied to an electronic book reader (e-book), a poster, a digital signage, a public information display (PID), an advertisement in a vehicle such as a train, displays of various cards such as a credit card, and the like. An example of the electronic device is illustrated in FIG. 7.

Figure 7:
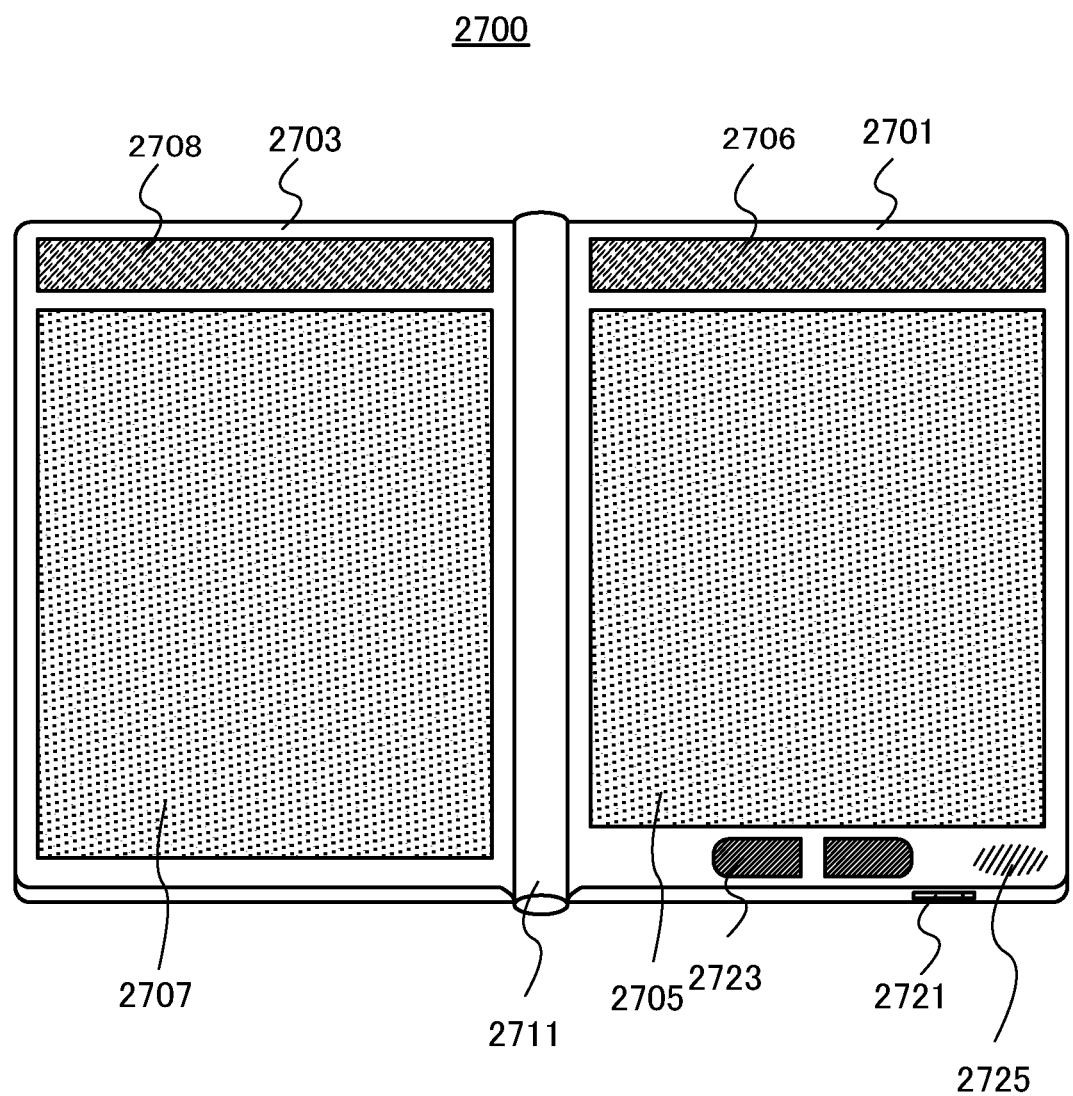
FIG. 7 is a diagram illustrating one mode of an electronic device.

FIG. 7 illustrates an electronic book reader 2700 as one example of such electric appliances. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display one image or different images. In the case where the display portion 2705 and the display portion 2707 display different images, for example, text data can be displayed on a display portion on the right side (the display portion 2705 in FIG. 7) and image data can be displayed on a display portion on the left side (the display portion 2707 in FIG. 7).

FIG. 7 illustrates an example in which the housing 2701 is provided with an operation portion and the like. For example, the housing 2701 is provided with a power switch 2721, an operation key 2723, a speaker 2725, and the like. With the operation key 2723, pages can be turned over. Note that a keyboard, a pointing device, or the like may also be provided on the surface of the housing, on which the display portion is provided. Furthermore, an external connection terminal (an earphone terminal, a USB terminal, a terminal that can be connected to an AC adapter or various cables such as a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.
(Embodiment 8)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 8A:
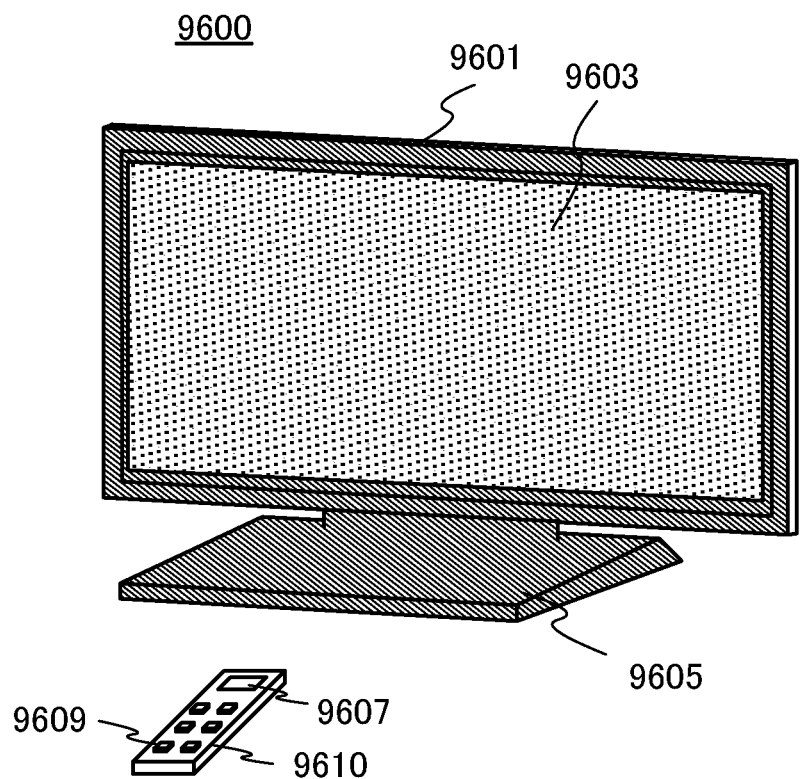
FIGS. 8A and 8B are each a diagram illustrating one mode of an electronic device.

FIG. 8A illustrates a television set 9600 as one example of such electronic devices. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 8B:
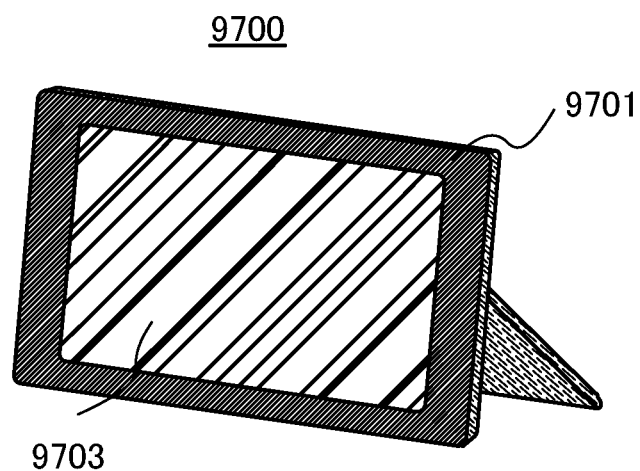

FIG. 8B illustrates a digital photo frame 9700 as one example of such electronic devices. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

EXAMPLE 1

In Example 1, the formation process of an oxide insulating film and an oxide semiconductor film, and the relation between the timing of heat treatment and the amount of oxygen desorbed from the oxide insulating film will be described with reference to FIGS. 9A to 9C, FIGS. 10A to 10C, and FIGS. 11A to 11C.

First, a method of forming each sample will be described. In Example 1, at least one step of Steps 1 to 4 below is conducted to form samples.
(Step 1) An oxide insulating film is formed over a substrate. At this time, a 300-nm-thick silicon oxide film is formed as the oxide insulating film.

The oxide insulating film is formed by an RF sputtering method under conditions that a quartz target is used, argon with a flow rate of 25 sccm and oxygen with a flow rate of 25 sccm are used as sputtering gases, the power of a high frequency power source with a frequency of 13.56 MHz is 1.5 kW, the pressure is 0.4 Pa, the distance between the substrate and the target is 60 mm, and the substrate temperature is 100° C.
(Step 2) An oxide semiconductor film is formed over the oxide insulating film. At this time, a 30-nm-thick In—Ga—Zn—O film is formed as the oxide semiconductor film.

The oxide semiconductor film is formed by a DC sputtering method under conditions that an In—Ga—Zn—O ($In_2O_3$:$Ga_2O_3$:ZnO=1:1:2 [molar ratio]) target is used, argon with a flow rate of 30 sccm and oxygen with a flow rate of 15 sccm are used as sputtering gases, the power of the power source is 0.5 kW, the pressure is 0.4 Pa, the distance between the substrate and the target is 60 mm, and the substrate temperature is 200° C.
(Step 3) A mask is formed over the oxide semiconductor film by a photolithography process, and then the oxide semiconductor film is partially etched to form an island-shaped oxide semiconductor film.
(Step 4) Heat treatment is conducted.

The heat treatment is conducted as follows. Samples are heated at 450° C. in an electric furnace with a nitrogen atmosphere and held for 1 hour.

Sample 1, Sample 3, and Sample 5 are not subjected to the heat treatment while Sample 2, Sample 4, and Sample 6 are subjected to the heat treatment. Further, Sample 2, Sample 4, and Sample 6 are subjected to the heat treatment at different timings.

In Sample 1, the oxide semiconductor film is removed after Step 1 and Step 2. In Sample 2, the oxide semiconductor film is removed after Step 4 (heat treatment) is conducted following Step 1 and Step 2.

As for Sample 3, Step 1 is conducted. As for Sample 4, Step 4 (heat treatment) is conducted after Step 1.

In Sample 5, the island-shaped oxide semiconductor film is removed after Steps 1 to 3. In Sample 6, the island-line oxide semiconductor film is removed after Step 4 (heat treatment) is conducted following Steps 1 to 3.

Next, the degassing yields of Samples 1 to 6 are measured by TDS analysis. A thermal desorption spectrometer EMD-WA1000S/W, manufactured by ESCO Ltd., was used for the TDS analysis. Note that TDS analysis is an analysis method in which a sample is heated in a vacuum case and a gas component generated from the sample when the temperature of the sample is increased is detected by a quadrupole mass analyzer. Detected gas components are distinguished from each other by the value of m/z (mass/charge). TDS spectra when m/z is 32 are shown here. Note that there are an oxygen molecule ($O_2$) and the like as a component of m/z of 32.

Figure 9A:
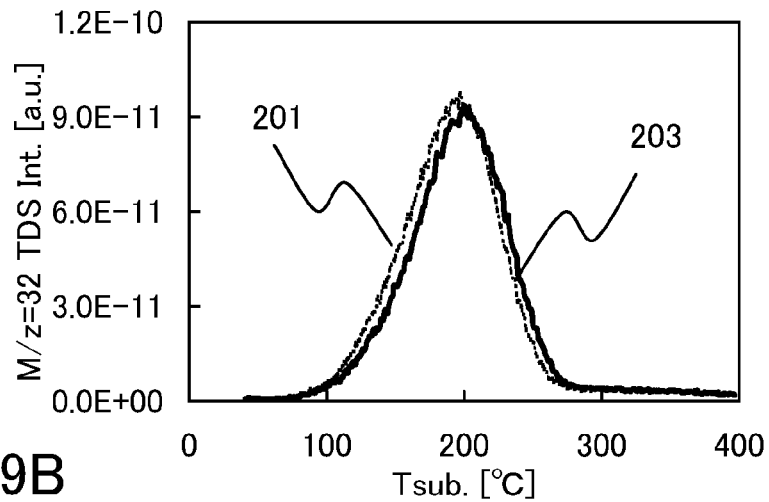
FIGS. 9A to 9C are graphs of results of TDS analysis.

TDS spectra of Sample 1 (not heated) and Sample 2 (heated) are shown by a broken line 201 and a solid line 203 respectively in FIG. 9A.

Figure 9B:
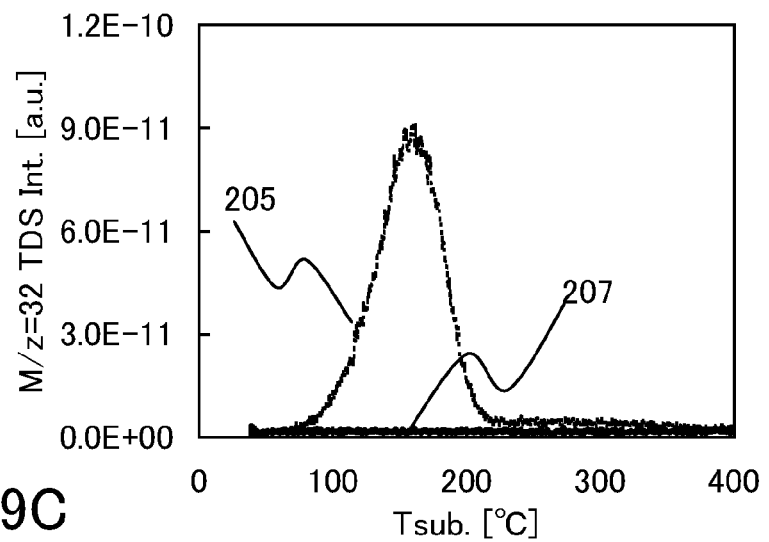

TDS spectra of Sample 3 (not heated) and Sample 4 (heated) are shown by a broken line 205 and a solid line 207 respectively in FIG. 9B.

Figure 9C:
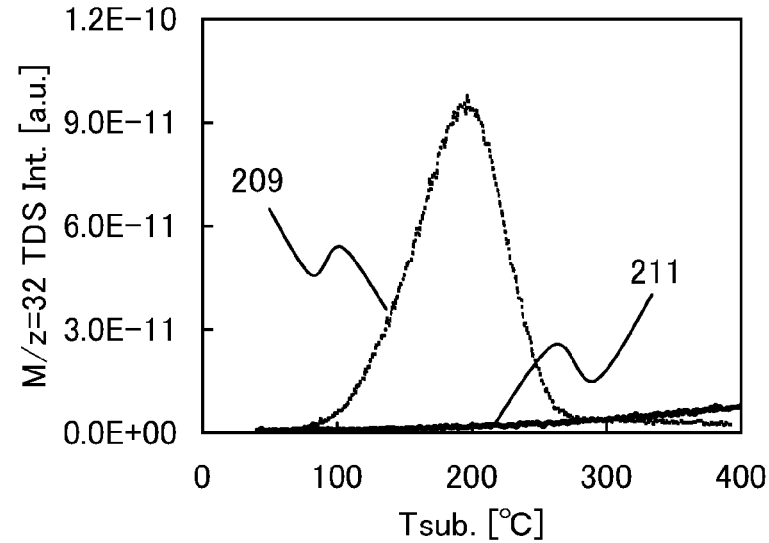

TDS spectra of Sample 5 (not heated) and Sample 6 (heated) are shown by a broken line 209 and a solid line 211 respectively in FIG. 9C.

Figure 10A:
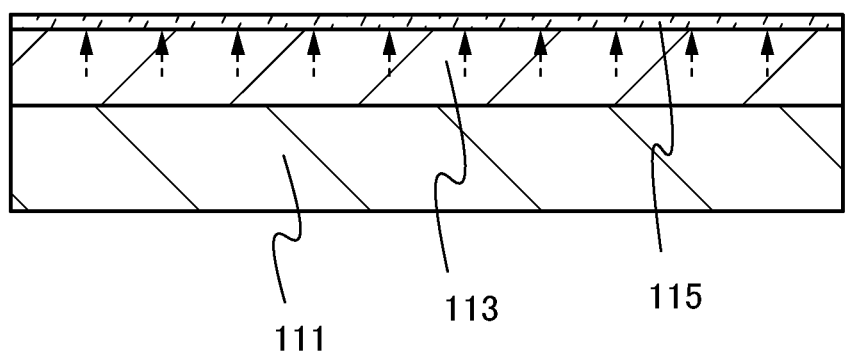
FIGS. 10A to 10C are cross-sectional views each illustrating the relation between heat treatment and the amount of desorbed oxygen.
Figure 10B:
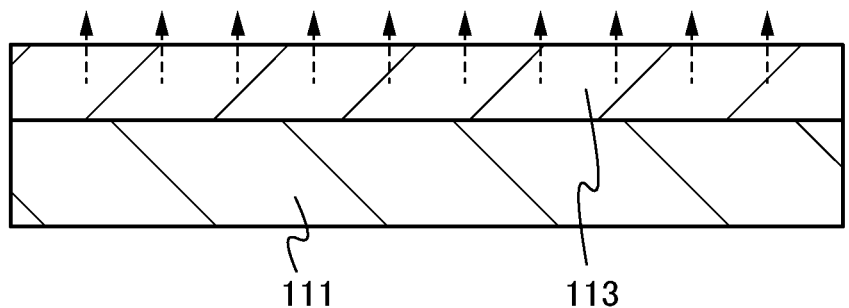
Figure 10C:
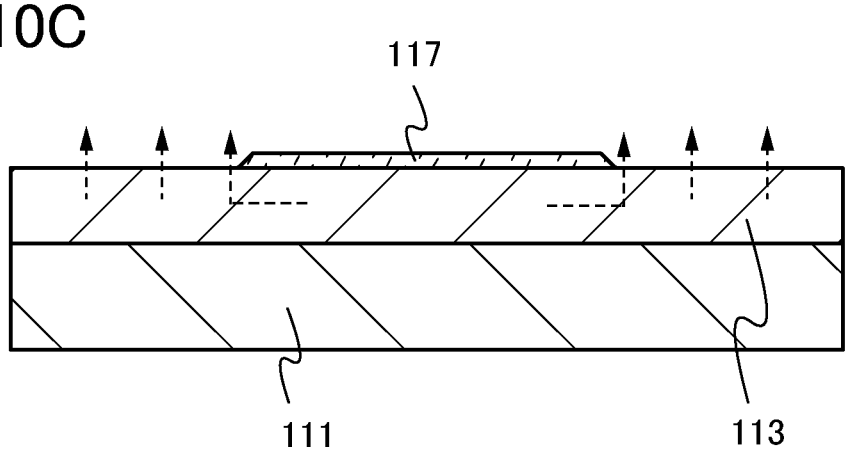

FIGS. 10A, 10B, and 10C are views illustrating models of oxygen released from oxide insulating films 113 at the heat treatment for Samples 2, 4, and 6 respectively.

As illustrated in FIG. 10A, the oxide insulating film 113 and an oxide semiconductor film 115 stacked over a substrate 111 are heated so that the oxide semiconductor film 115 serves as a protective film to suppress oxygen release out of the oxide insulating film 113. For that reason, as illustrated in FIG. 9A, there is almost no difference in the amount of released oxygen with or without heat treatment in TDS analysis in Sample 1 and Sample 2 each of which oxide semiconductor film is removed. This is because the amount of oxygen, which can be desorbed by heat treatment, contained in the oxide insulating film is not reduced so much.

On the other hand, as illustrated in FIG. 10B, heat treatment is conducted when an oxide semiconductor film covering the surface of the oxide insulating film 113 formed over the substrate 111 is not formed, oxygen is released from the oxide insulating film 113. For that reason, as shown by the solid line 207 in FIG. 9B, the amount of released oxygen of Sample 4 which is heated is smaller in TDS analysis than that of Sample 3. This is because part of oxygen is released out of the oxide insulating film by heat treatment, and the amount of oxygen, which can be desorbed by heat treatment, contained in the oxide insulating film is reduced.

Further, as illustrated in FIG. 10C, heat treatment is conducted when an island-shaped oxide semiconductor film 117 covering part of the surface of oxide insulating film 113 formed over the substrate 111 is formed, so that oxygen is released from an exposed portion of the oxide insulating film 113. In addition, oxygen contained in the oxide insulating film 113 in contact with the island-shaped oxide semiconductor film 117 is diffused and released from the exposed portion of the oxide insulating film 113. This is because the diffusion coefficient of oxygen in the oxide insulating film 113 is larger than the diffusion coefficient of oxygen from the oxide insulating film 113 into the oxide semiconductor film and thus the diffusion speed inside the oxygen insulating film is faster than the diffusion speed of oxygen from the oxide insulating film into the oxide semiconductor film, so that oxygen is diffused in the periphery of the island-shaped oxide semiconductor film. Specifically, it is confirmed by analysis that the diffusion coefficient of oxygen in the oxide insulating film 113 at the heat treatment of 450° C. is about $1 \times 10^{-10}$ cm$^2$/sec and the diffusion coefficient of oxygen in the oxide semiconductor film 117 at the heat treatment of 450° C. is about $1 \times 10^{-17}$ cm$^2$/sec. As for the diffusion coefficient of oxygen in the oxide semiconductor film 117, the value of an In—Ga—Zn—O film as the oxide semiconductor film is shown and other oxide semiconductors show similar tendency. For example, the diffusion coefficient of oxygen in an In—Sn—O film is about $6 \times 10^{-16}$ cm$^2$/sec, and is much smaller than the diffusion coefficient of oxygen in the oxide insulating film 113. Thus, as shown by the solid line 211 in FIG. 9C, the amount of released oxygen in TDS analysis of Sample 6 which is heated is smaller than that of Sample 5. This is because part of oxygen is released out of the oxide insulating film and the amount of oxygen, which can be desorbed by heat treatment, contained in the oxide insulating film is reduced.

As described above, heat treatment is conducted at the phase where the oxide semiconductor film 115 is formed over the oxide insulating film 113 and the island-shaped oxide semiconductor film 117 is not yet formed, and thereby oxygen contained in the oxide insulating film 113 can be diffused efficiently into the oxide semiconductor film 115.

EXAMPLE 2

In Example 2, a formation method and electric characteristics of a transistor will be described with reference to FIGS. 1A to 1E and FIGS. 11A to 11C.

In Example 2, similarly to Example 1, Samples 7 to 9 are formed in steps of heat treatment conducted at different timings. Sample 7 is subjected to heat treatment after an oxide semiconductor film is formed over an oxide insulating film. Sample 8 is subjected to heat treatment after an oxide insulating film is formed. Sample 9 is subjected to heat treatment after an oxide semiconductor film is formed over an oxide insulating film, and part of the oxide semiconductor film is etched to form an island-shaped oxide semiconductor film.

First, a method for forming each of Samples 7 to 9 is described.

As illustrated in FIG. 1A, the oxide insulating film 53 is formed over the substrate 51. The oxide semiconductor film 55 is formed over the oxide insulating film 53. Note that Sample 8 is subjected to heat treatment after the oxide insulating film 53 is formed and before the oxide semiconductor film 55 is formed. In addition, Sample 7 is subjected to heat treatment after the oxide semiconductor film 55 is formed and before the oxide semiconductor film 59 illustrated in FIG. 1C is formed.

A glass substrate AN100 (manufactured by Asahi Glass Co., Ltd.) is used as the substrate 51.

The deposition conduction of the oxide insulating film 53 is the deposition condition of the oxide insulating film described in Step 1 of Example 1 and a silicon oxide film with a thickness of 300 nm is formed.

The deposition conduction of the oxide semiconductor film 55 is the deposition condition of the oxide semiconductor film described in Step 2 of Example 1 and an In—Ga—Zn—O film with a thickness of 30 nm is formed.

The heat treatment on Samples 7 and 8 is conducted with the condition of the heat treatment described in Step 4 of Example 1.

Then, after a mask is formed over the oxide semiconductor film by a photolithography process, the oxide semiconductor film is etched with use of the mask. Note that Sample 9 is subjected to heat treatment after the oxide semiconductor film is etched. Through the above steps, the oxide semiconductor film 59 is formed as illustrated in FIG. 1C.

At this time, wet etching is employed to etch the oxide semiconductor film.

The heat treatment on Sample 9 is conducted with the condition of the heat treatment described in Step 4 of Example 1.

Then, the pair of electrodes 61 is formed over the oxide semiconductor film 59 (FIG. 1D).

In this case, a 100-nm-thick tungsten film is formed as a conductive film by a sputtering method. Then, a mask is formed over the conductive film by a photolithography process and the conductive film is dry-etched with use of the mask to form the pair of electrodes 61. After that, the mask is removed.

Then, the gate insulating film 63 is formed over the oxide semiconductor film 59 and the pair of electrodes 61. The gate electrode 65 is formed over the gate insulating film 63. The insulating film 69 serving as a protective film is formed (FIG. 1E).

As the gate insulating film 63, a silicon oxynitride film is formed by a plasma CVD method. In Sample 7 and Sample 8, the gate insulating film has a thickness of 30 nm while in Sample 9, the gate insulating film has a thickness of 15 nm.

Further, over the gate insulating film 63, a 15-nm-thick tantalum nitride film is formed by a sputtering method and then a 135-nm-thick tungsten film is formed by a sputtering method. Then, a mask is formed by a photolithography process, then the tungsten film and the tantalum nitride film are dry-etched with use of the mask to form the gate electrode 65, and then the mask is removed.

In this case, as the insulating film 69, a silicon oxynitride film with a thickness of 300 nm is formed by a plasma CVD method.

Next, although not illustrated, a mask is formed over the insulating film 69 by a photolithography process and part of the insulating film 69 is etched with use of the mask to form a contact hole. At this time, the gate insulating film 63 and the insulating film 69 are dry-etched to form contact holes where the pair of electrodes 61 and the gate electrode 65 are exposed.

Then, wirings connecting to the pair of electrodes 61 and the gate electrode 65 are formed.

Here, a 50-nm-thick titanium film, a 100-nm-thick aluminum film and a 5-nm-thick titanium film are sequentially formed over the insulating film 69 by a sputtering method. Then, a mask is formed by a photolithography process and the titanium film, the aluminum film, and the titanium film are dry-etched with use of the mask to form a wiring, and then the mask is removed.

Then, Samples are heated in an electric furnace with a nitrogen atmosphere at 250° C. and held for 1 hour.

Through the above-described steps, the transistors are formed. Then, electric characteristics of the transistors formed in Samples 7 to 9 are measured. The measurement results of the 25 points are all shown. The channel length L is 3 μm, and the channel width W is 10 μl.

Figure 11A:
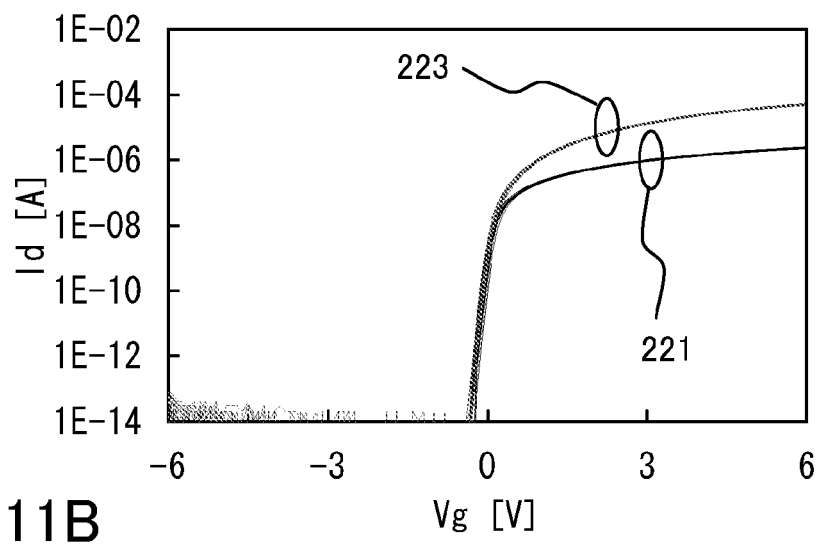
FIGS. 11A to 11C are graphs showing electric characteristics of a thin film transistor.
Figure 11B:
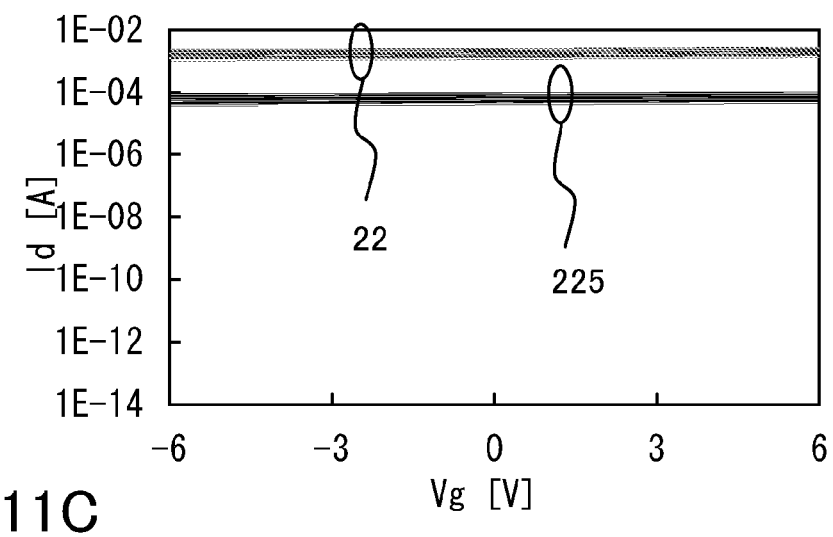
Figure 11C:
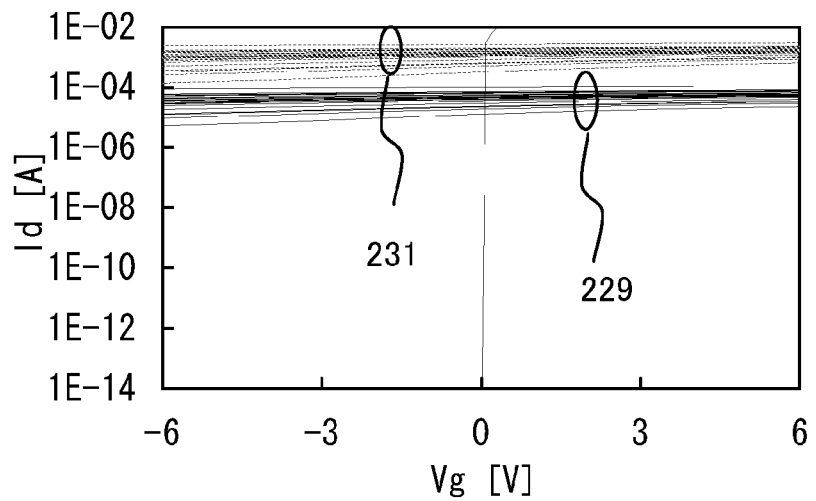

FIGS. 11A, 11B, and 11C show electric characteristics of the transistors formed in Sample 7, Sample 8, and Sample 9 respectively. Curves 221, 225, and 229 are current-voltage curves when a drain voltage of 0.1 V is applied to each transistor, while curves 223, 227, and 231 are current-voltage curves when a drain voltage of 3 V is applied to each transistor.

The current-voltage curves shown in FIG. 11A exhibits high on/off ratio and switching characteristics are obtained, whereas the current-voltage curves shown in FIGS. 11B and 11C do not exhibit on/off ratio and switching characteristics are not obtained.

From the TDS analysis results in Example 1, as shown with Sample 2, even when the heat treatment is conducted in the state where the surface of the oxide insulating film is covered with the oxide semiconductor film, the amount of oxygen, which can be desorbed by heat treatment, contained in the oxide insulating film is not reduced so much, and thus release of oxygen hardly occurs. On the other hand, with regards to Sample 4 and Sample 6, the heat treatment is conducted in the state that the oxide insulating film is exposed and thus oxygen is released outside.

Based on the above description, in Sample 7 of Example 2 which is subjected to the heat treatment at the same timing of heat treatment as Sample 2, part of oxygen contained in the oxide insulating film is diffused into the oxide semiconductor film by the heat treatment, and oxygen release to the outside is suppressed, so that the number of oxygen vacancies in the oxide semiconductor film is reduced. Therefore, the transistor using the oxide semiconductor film has switching characteristics.

On the other hand, with regards to Sample 8 and Sample 9 of Example 2 which are subjected to heat treatment at the same timings of heat treatment as Sample 4 and Sample 6, part of oxygen contained in the oxide insulating film is released outside by the heat treatment, and thus the amount of diffused oxygen into the oxide semiconductor film is small and many oxygen vacancies serving as carrier sources are present. Therefore, the oxide semiconductor film has an n-type conductivity and thus a transistor using the oxide semiconductor film does not have switching characteristics.

Based on the above description, the heat treatment is conducted in the state that the surface of the oxide insulating film, from which part of oxygen is desorbed by heat treatment, is covered with the oxide semiconductor film, then etching of the oxide semiconductor film into a predetermined shape is conducted, and the gate insulating film and the gate electrode are formed, whereby a transistor with sufficiently high on/off ratio and little shift to a negative side of a threshold voltage can be provided.

This application is based on Japanese Patent Application serial no. 2010-181832 filed with Japan Patent Office on Aug. 16, 2010, the entire contents of which are hereby incorporated by reference.

What is claimed is:

1. A method for manufacturing a semiconductor device comprising the steps of:
    forming an oxide insulating film over a substrate, wherein the oxide insulating film contains oxygen with a higher proportion than a proportion of oxygen in a stoichiometric composition;
    forming an oxide semiconductor film on and in contact with the oxide insulating film;
    reducing hydrogen concentration and oxygen vacancies in the oxide semiconductor film by performing a heat treatment;

etching parts of the oxide semiconductor film to form an island-shaped oxide semiconductor film;

forming a gate insulating film over the island-shaped oxide semiconductor film; and forming a gate electrode overlapping with the island-shaped oxide semiconductor film with the gate insulating film interposed therebetween, wherein an amount of oxygen desorbed from the oxide insulating film by the heat treatment is higher than or equal to $1.0 \times 10^{20}$ atoms/cm$^3$.

2. The method for manufacturing a semiconductor device according to claim 1, further comprising a step of forming a buffer layer having an n-type conductivity on the oxide semiconductor film.

3. The method for manufacturing a semiconductor device according to claim 1, wherein, in the oxide insulating film, a whole region under the island-shaped oxide semiconductor film is directly in contact with the substrate.

4. The method for manufacturing a semiconductor device according to claim 1, wherein the heat treatment is performed at a temperature higher than or equal to 150° C. and lower than a strain point of the substrate.

5. The method for manufacturing a semiconductor device according to claim 1, wherein the gate insulating film comprises silicon oxide.

6. The method for manufacturing a semiconductor device according to claim 1, wherein the semiconductor device is incorporated in one of a monitor of a computer, a digital photo frame, an e-book reader, a cellular phone, a digital camera, and a television set.

7. A method for manufacturing a semiconductor device comprising the steps of:

forming an oxide insulating film on a substrate, wherein the oxide insulating film contains oxygen with a higher proportion than a proportion of oxygen in a stoichiometric composition;

forming an oxide semiconductor film on and in contact with the oxide insulating film;

reducing hydrogen concentration of the oxide semiconductor film and diffusing oxygen contained in the oxide insulating film into the oxide semiconductor film by performing a heat treatment;

forming an island-shaped oxide semiconductor film by etching the oxide semiconductor film;

forming a gate insulating film over the island-shaped oxide semiconductor film; and forming a gate electrode overlapping with the island-shaped oxide semiconductor film with the gate insulating film interposed therebetween, wherein an amount of oxygen desorbed from the oxide insulating film by the heat treatment is higher than or equal to $1.0 \times 10^{20}$ atoms/cm$^3$.

8. The method for manufacturing a semiconductor device according to claim 7, further comprising a step of forming a buffer layer having an n-type conductivity on the oxide semiconductor film.

9. The method for manufacturing a semiconductor device according to claim 7, wherein, in the oxide insulating film, a whole region under the island-shaped oxide semiconductor film is directly in contact with the substrate.

10. The method for manufacturing a semiconductor device according to claim 7, wherein the heat treatment is performed at a temperature higher than or equal to 150° C. and lower than a strain point of the substrate.

11. The method for manufacturing a semiconductor device according to claim 7, wherein the gate insulating film comprises silicon oxide.

12. The method for manufacturing a semiconductor device according to claim 7, wherein the semiconductor device is incorporated in one of a monitor of a computer, a digital photo frame, an e-book reader, a cellular phone, a digital camera, and a television set.

13. A method for manufacturing a semiconductor device comprising the steps of:

forming an oxide insulating film over a substrate, wherein the oxide insulating film contains oxygen with a higher proportion than a proportion of oxygen in a stoichiometric composition;

forming a first gate electrode over the oxide insulating film;

forming a first gate insulating film over the first gate electrode and the oxide insulating film;

forming an oxide semiconductor film over the first gate insulating film;

reducing hydrogen concentration and oxygen vacancies in the oxide semiconductor film by performing a heat treatment;

etching part of the oxide semiconductor film to form an island-shaped oxide semiconductor film after performing the heat treatment;

forming a second gate insulating film over the island-shaped oxide semiconductor film; and forming a second gate electrode overlapping with the island-shaped oxide semiconductor film, the first gate insulating film, and the first gate electrode with the second gate insulating film interposed therebetween.

14. The method for manufacturing a semiconductor device according to claim 13, wherein an amount of oxygen desorbed from the oxide insulating film by the heat treatment is higher than or equal to $1.0 \times 10^{20}$ atoms/cm$^3$.

15. The method for manufacturing a semiconductor device according to claim 13, wherein the first gate insulating film comprises silicon oxide.

16. The method for manufacturing a semiconductor device according to claim 13, wherein the heat treatment is performed at a temperature higher than or equal to 150° C. and lower than a strain point of the substrate.

17. The method for manufacturing a semiconductor device according to claim 13, wherein the second gate insulating film comprises silicon oxide.

18. The method for manufacturing a semiconductor device according to claim 13, wherein the semiconductor device is incorporated in one of a monitor of a computer, a digital photo frame, an e-book reader, a cellular phone, a digital camera, and a television set.

* * * * *